US006674216B2

(12) United States Patent
Christensen

(10) Patent No.: US 6,674,216 B2
(45) Date of Patent: Jan. 6, 2004

(54) ULTRASOUND PORTABLE TUBULAR TRANSDUCER

(76) Inventor: Juan Carlos Christensen, Discépolo 909, Dpto. F "2B", (1642) San Isidro, Buenos Aires (AR)

( * ) Notice: Subject to any disclaimer, the term of this patent is extended or adjusted under 35 U.S.C. 154(b) by 0 days.

(21) Appl. No.: 10/139,511

(22) Filed: May 7, 2002

(65) Prior Publication Data

US 2003/0001458 A1 Jan. 2, 2003

(30) Foreign Application Priority Data

May 8, 2001 (AR) .................................... P01 01 02161

(51) Int. Cl.[7] ................................................ H01L 41/08
(52) U.S. Cl. ................................................ 310/323.01
(58) Field of Search ................................ 310/328, 323, 310/325

(56) References Cited

U.S. PATENT DOCUMENTS 2,990,482 A * 6/1961 Kenny ........................ 310/325
3,546,498 A * 12/1970 Mc Master ............ 310/323.19
5,200,666 A * 4/1993 Walter et al. .......... 310/323.01
6,111,337 A * 8/2000 Christensen ................ 310/328

* cited by examiner

*Primary Examiner*—Thomas M. Dougherty
*Assistant Examiner*—Karen Addison
(74) *Attorney, Agent, or Firm*—Finnegan, Henderson, Farabow, Garrett & Dunner, L.L.P.

(57) ABSTRACT

Portable ultrasound tubular transducer, that generates cavitation in liquids, of the type that comprises at least one electromechanical transducer assembly, characterized in that at least one electromechanical transducer assembly is embedded inside a metallic pipe, and comprises one or more piezoelectric crystals which are power-fed from the exterior, and which are coupled to a first mass embedded at one end of said metallic pipe and to a second mass disposed in the interior of such metallic pipe and linked with said first mass, said portable tubular transducer being provided with a subjection medium.

7 Claims, 3 Drawing Sheets

ULTRASOUND PORTABLE TUBULAR TRANSDUCER

BACKGROUND OF THE INVENTION

The invention relates to an ultrasound portable tubular transducer that generates cavitation in liquids, in which an electromechanical transducer, is solderless embedded, at one end and inside a metallic pipe. The transducer resonates at the resonant frequency of the pipe. The transducer's other end has embedded either a countermass or other electromechanical transducer of identical characteristics and identical assemblage and with connecting cables running through the countermass or through a node of minimal vibration of the metallic pipe, where a smaller diameter pipe is fixed for its support, which is particularly apt to perform tasks that require ultrasound cavitation in liquids.

The transducer of the present invention has several uses that are advantageous. One such use is the cleaning of different types of pieces or parts without requiring the use of stainless steel containers or any other specific-form container. Another such use is the cleaning of different pieces or parts using different cleaning liquids without requiring the use of several cleaning machines. Another use is the cleaning of different pieces or parts taking advantage of using existing recipients such as vats, sinks, buckets, boxes used in surgery, as well as glass containers. Another use is the cleaning of receptacles filled with liquids such as tanks or sinks. A further use is the cleaning of volumes that can be filled with liquids such as dosing apparatuses, mixing or kneading machines, as well as the interior part of pipes.

At present, the ultrasonic cleaning of different pieces is performed in a liquid medium contained inside stainless steel vats with transducers glued to their exteriors. These transducers being of the Langevin type which make them vibrate, thus provoking a phenomenon called cavitation. This cavitation causes an effect analogous to a microscopic brushing to the visible as well as the non-visible pieces or parts.

The size of the vat to be used and the required ultrasonic power are determined by the size or by the quantity of the pieces to be cleaned.

This is a costly solution because this method requires stainless steel vats of different sizes which have low efficiency and are very noisy. When the use of several transducers to make vibrate the vats and the vats to make vibrate the liquid are required, too much energy is lost. In addition, detuning of the transducers among themselves generates intense noise which is not only uncomfortable but harmful to the health of the user. This solution is of limited reliability because the transducers are glued and may become unglued. In addition, this method is not very flexible because the washing can only take place inside the machine.

Another type of solution is the use of submergible transducers. This method typically consists of using several transducers of the Langevin type which are glued inside a hermetic stainless steel box. In this method tubular-type transducers can also be used. These transducers are of greater efficiency.

Tubular transducers permit greater freedom because the vat does not have to be a stainless steel one, they generate the ultrasound in homogenous form, occupy little space, and the transducer or transducers to be used may be determined by the power density needed.

When each tubular transducer is excited by means of a self-syntony generator and when no vibration from the walls of the vat takes place as the working principle, the noise is reduced to a great extent and the efficiency is increased significantly.

These transducers are placed in a fixed manner to the vat. The user will be searching their best position and will work with the transducers being totally submerged in order to dissipate the heat in the liquid. This means these transducers have not been thought of for portable use.

Transducers of this type are found in U.S. Pat. No. 5,200,666 to Walter et al., and in U.S. Pat. No. 6,111,337 to Christensen.

SUMMARY OF THE INVENTION

In order to make up for all the above-mentioned disadvantages, in the present invention, the electromechanical transducer or transducers are coupled at the inside end of the metallic pipe that resonates and that serves, at the same time, as container, and that is supported by a handling means such as a pipe with a diameter smaller than that of the resonant metallic pipe and that is located in the center of the resonant metallic pipe or in the countermass embedded at one end of the metallic pipe.

In the countermass configuration, where the electromechanical transducer is located inside one of the ends of the metallic pipe, a greater ultrasound intensity is radiated at this end. This is of particular interest to a portable application, since this allows this end to face the dirtiest parts of the piece or part to be washed.

In addition, this configuration allows for better dissipation of the heat than in other known tubular transducers, because the surface in contact with the liquid is greater.

Since the countermass presents minimum vibration and the coupling to the smaller diameter pipe supporting it is weak, the vibrations are not transmitted and do not generate discomfort to the user while he sustains it with the hand.

In the symmetrical configuration where two electromechanical transducers are equal at the ends, the difference in radiation between the ends and the pipe is not too great, as this receives twice the power. This is desirable as the objective is to place the pipe in front of the piece or part to be cleaned. Also the heat is better dissipated in the liquid because the tubular transducer has more surface in contact with same.

Since the center of the pipe has a minimum vibration and coupling to the smaller diameter pipe that supports it is weak, the vibrations are not transmitted and therefore do not generate disturbances to the user while he sustains it with the hand or to any mechanism of support.

In both cases an abrupt change of impedance is produced when the transducers are taken out of the liquid, wherefrom if one were to operate the transducers in a continuous manner, taking the tubular transducer out of one vat and transferring it to another vat without damaging the tubular transducer, it is necessary to constantly sense the impedance by means of reading, in real time, the output tension and the current output from the generator in such manner that, when the impedance goes to below an established value Z min=V output/I output, at this moment, the energy coming from the generator must be interrupted. This energy can then be reestablished in a continuous manner only when the impedance returns to its normal level.

This way, overheating of the electromechanical transducer is avoided. At the same time, it allows for the taking out and for the placing in of the portable transducer of the invention in different vats and liquids at will, and without having to shut off the generator every time, thus avoiding operational mistakes.

The portable characteristic amplifies enormously the amount of possible applications and extends the use of ultrasound.

It is worth noting that with ultrasound it is possible to clean with biodegradable liquids that are not contaminant. This means that as its use increases it improves both the conditions for the environment as well as the conditions for the users.

For example, it allows the cleaning of different pieces with different liquids in vats with different shapes and different materials using the same transducer and passing said transducer from one vat to another.

It also allows for the use of an existing sink, such as a kitchen sink, to clean silverware, dishes, or any other item desired.

The tubular transducer may also be mounted at an end of a flexible pipe where the energy-conducting cables go, which configuration permits introduction of the transducer into clogged pipes and be able to get the clogging material or rust out, thereby increasing their useful lives. This being an innovative application that avoids costly changes of pipes.

Because of its portability the transducer of the invention can also be placed or introduced inside a cavity such as a small lattice, a can of paint, a deposit, or it may be introduced in a throw-away container.

An additional advantage is the fact that the electromechanical transducer is housed inside a pipe that radiates the ultrasound, this acts as a container making it much more compact, lighter, with less amount of pieces than those used by other tubular transducers and consequently much more economic.

Another additional advantage of this innovating configuration is that the tubular transducer is assembled by means of the embedding, with pressure, of its pieces, rather than by welding, or turning on the lathe of coupling acoustic transformers, thus reducing the manufacturing processes, the need for special care due to overheating in the welding process, the quality control of the welding process, thus eliminating a possible rupture zone and the origin of its greatest cost.

Another advantage of the embedding with pressure of its constitutive pieces is that, since the cavitation effect tends to concentrate in the discontinuities, for example, and particularly in the welding process, not having any welded parts, the major cause for greater wear of the material disappears, and a longer useful life for the transducer is therefore attained.

If, instead of having an assemblage for manual or portable use, a fixed mounting is used in a wall or at the bottom of a container, like other tubular transducers, this can be obtained with the advantage of its smaller size and lower cost.

According to the frequency of its use, the power used, and the application desired, the transducer of the invention can be manufactured with different lengths and diameters.

The tubular transducer, object of the present invention, that has two electromechanical transducer assemblies is used in applications that require more power. In addition, its manufacturing characteristics permit the economic use of titanium, a noble metal but an expensive one, since it takes a minimum amount of this metal, and, due to its configuration, it does not require complex mechanical processes or welding. This way it is possible to obtain a much more resistant and economical transducer than those now existing.

Other uses or applications of the transducer of the present invention are the treatment of waters, the degasification of liquids, the homogenization of mixtures, and the dilution in solvents, in which a compact and economical transducer, like this one, increases its usage possibilities.

The object of the present invention is then an ultrasound portable tubular transducer to generate the cavitation in liquids, of the type comprising at least a system of electromechanical transducer embedded, without welding, at one end and inside a metallic pipe, that resonates at the resonant frequency of the metallic pipe, and that at its other end has embedded a countermass or other electromechanical transducer system of identical characteristics and assembly, and with connection cables running either through the countermass or through a node of minimum vibration of the metallic pipe, where there is fixed a smaller diameter pipe, for its subjection.

The portable ultrasound tubular transducer basically consist of the combination of three elements or assemblies:

an electromechanical transducer assembly where electric power is converted in mechanical energy; a metallic pipe that makes itself resonate, and a countermass that resonates at the same frequency and that is used as a part of a subjection medium of the transducer. If the countermass is not employed, this is replaced by other electromechanical transducer assembly.

In a preferred version of the electromechanical transducer assembly one or more pre-stressed piezoelectric crystals are used, for example by means of a central rod, coupled to two masses that conform a resonant motor, one of them being embedded in the metallic pipe.

The number of crystals and their diameter depend on the frequency and the power at which its use is intended.

This electromechanical transducer assembly is coupled to the pipe which length and diameter are determined according to the specific application.

The countermass is embedded in the other end of the metallic pipe and has a central perforation for the assemblage of the smaller diameter pipe for the support of the portable transducer and for the passage of the cables, or for the connection of a hollow flexible pipe that allows the passage of the feeding cables and the introduction of the portable transducer inside a pipework.

When two electromechanical transducers assemblies are employed which assemblies are embedded in both ends of the pipe, the countermass is not used, the metallic pipe being provided with a smaller diameter pipe which is welded in its middle part to support the transducer and for passage of the cables.

BRIEF DESCRIPTION OF THE DRAWINGS

The invention will be better understood from the figures in which there are represented two preferred ways to realize same.

DETAILED DESCRIPTION OF THE INVENTION

Figure 1:
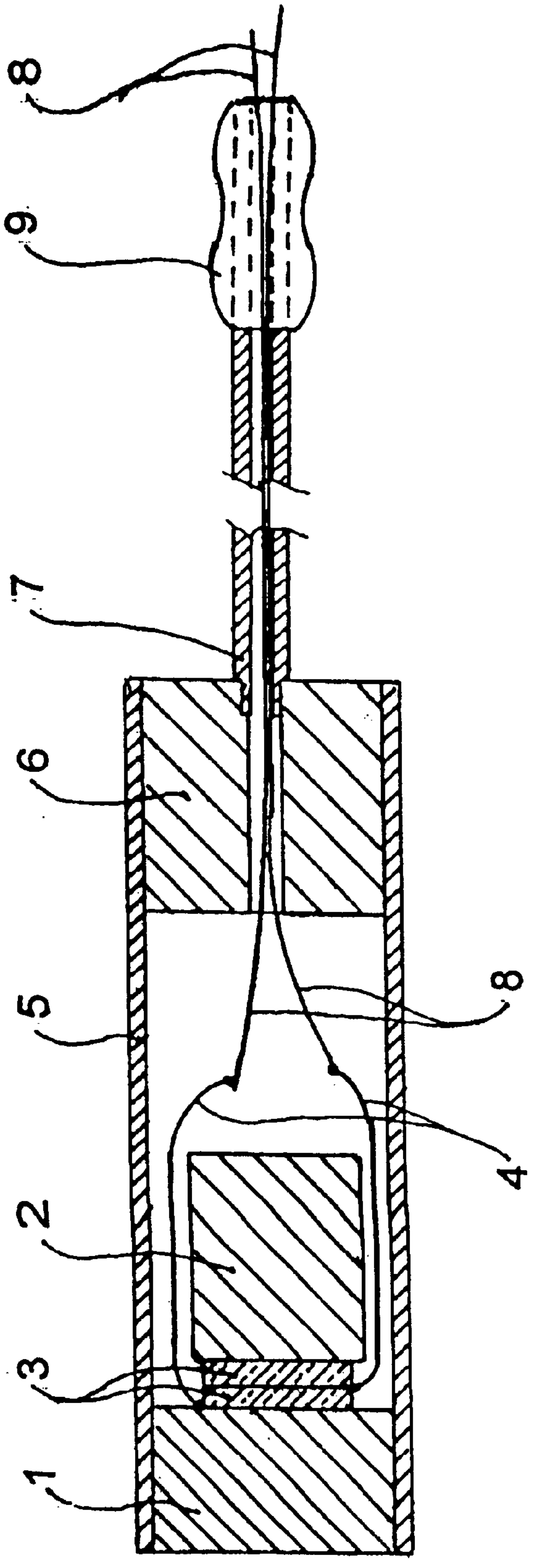
In FIG. 1, the portable tubular transducer, object of the present invention, is represented with the electromechanical transducer assembly with a pre-stressed rod at one a end, and the countermass at the other end of the pipe, and with a subjection medium for manual use.

In FIG. 1, metallic pipe 5 is represented with embedded countermass 6 whereby feeding cable 8 passes and forms a subjection medium with smaller diameter pipe 7, which is joined to such countermass 6 by one of its ends, being disposed, at the other end, of said smaller diameter pipe 7 one handle 9, to subject the portable tubular transducer.

The electromechanical transducer assembly is composed by piezoelectric crystals 3 that connect to the cable 8 with plates 4, by a first mass 1 embedded in metallic pipe 5 and by a second mass 2 that is linked to first mass 1 by a central rod that prestresses the crystals, the rod not being represented.

Figure 2:
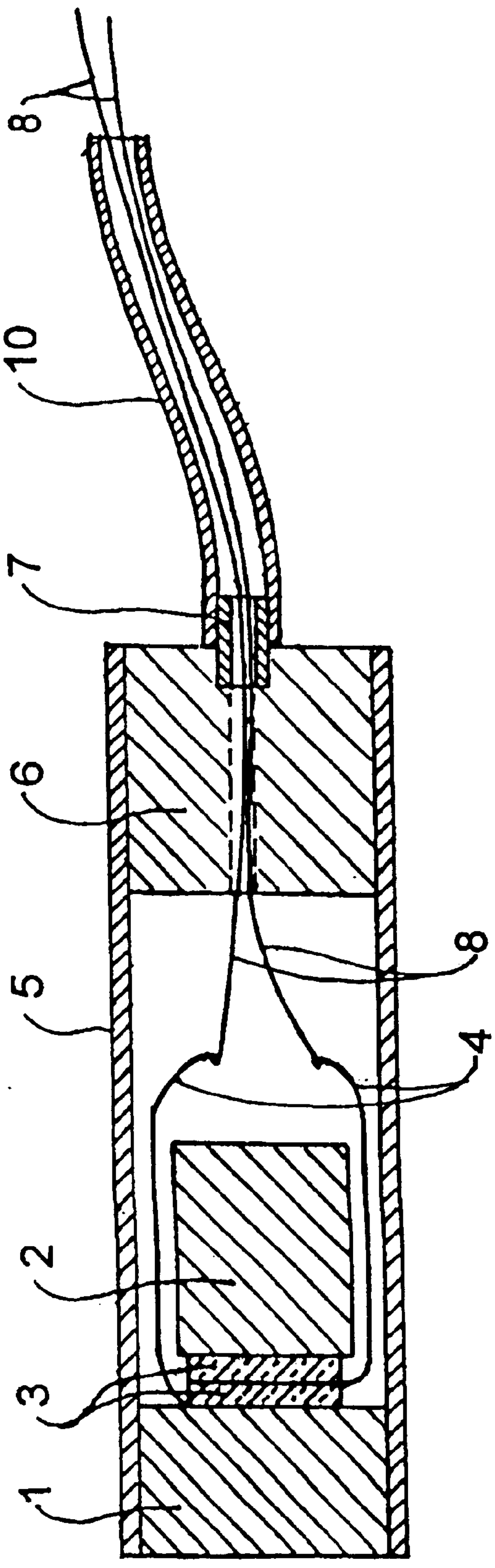
In FIG. 2, the portable transducer of FIG. 1 is seen associated with a hollow flexible pipe for the passageway of the feeding cables.

In FIG. 2, the portable tubular transducer of FIG. 1 is represented, where smaller diameter pipe 7 finds itself connected to hollow flexible pipe 10, that allows the passage of feeding cables 8, and the introduction of the portable tubular transducer in a pipework or inside a pipe.

Figure 3:
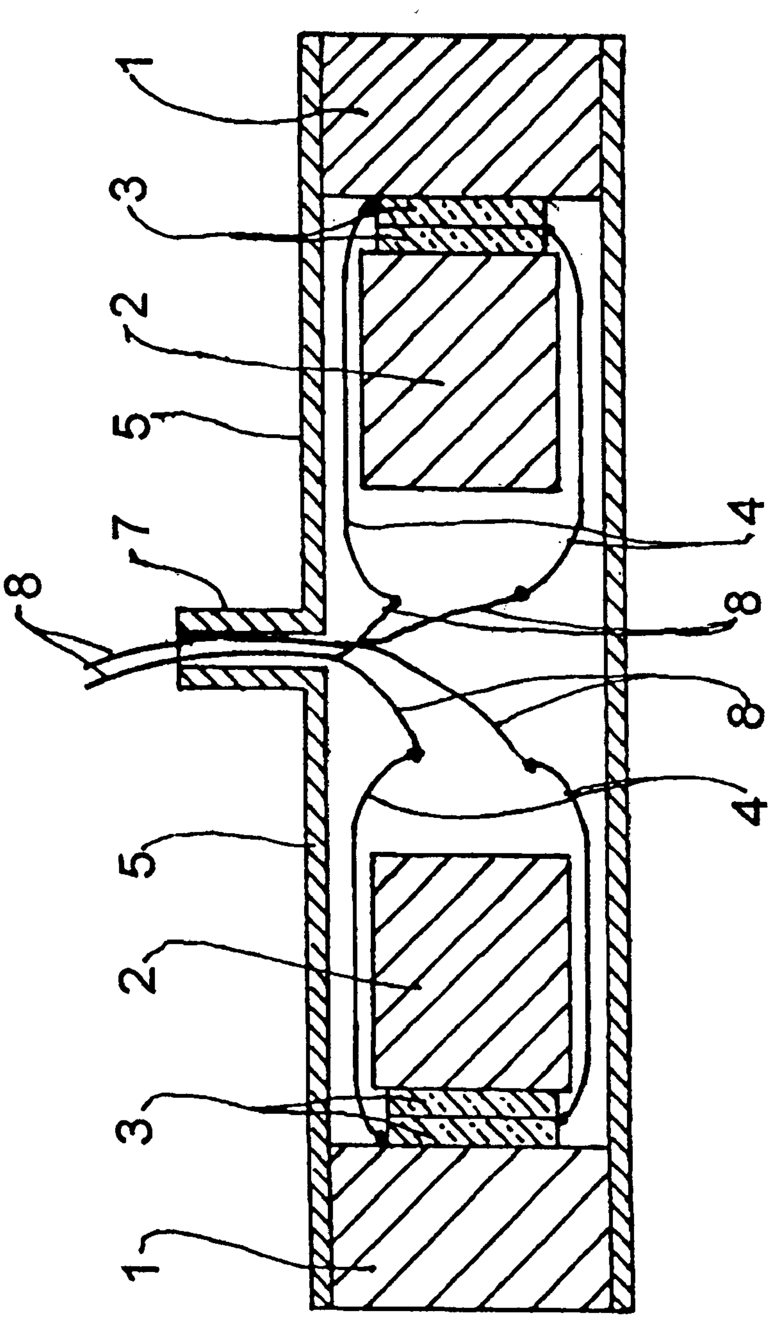
In FIG. 3, the transducer is represented with an identical electromechanical transducer assembly at each end and a smaller central diameter pipe with an application for fixed usage.

In FIG. 3, metallic pipe 5 is represented with smaller diameter pipe 7 to fasten and to pass cable 8 and, by means of thread 6, fasten the transducer to the wall of a vat, having at each end embedded the first masses 1 of two electromechanical transducer assemblies, with their piezoelectric crystals 3 that are connected to cable 8 with plates 4 and which are linked to second masses 2 with a rod that prestresses the crystals, the rod not being represented.

Different prototypes were built in stainless steel 316 with a 5 cm in diameter pipe to operate at a 25,000 Hz frequency.

Ceramic piezoelectric crystals of P8 material with 38 mm in diameter and 6 mm in thickness, and with a center hole of 12.8 mm were used.

Tests were conducted up to a power of 400 W, and excellent results were obtained in containers of 50 liters with a very good and uniform cavitation, cleaning the sample pieces in accordance to what was expected.

The impedance was of 400 ohms and resistive, which makes for output stage of the generator not to heat up due to inductive or capacitive components, a fact that improves the yield of the generator and reduces its cost.

Both uniformity of the cavitation around the pipe and greater intensity at the end were verified.

A transducer was built to be mounted in the vat. This was done in a vertical way, in a cylindrical vat and the cleaning results were excellent.

A prototype having a crystal of 15 mm in diameter, 3 mm in thickness, and 7 mm in its interior diameter was also built, with an stainless steel pipe of 25 mm in diameter, and was tested with a 80 W power. This becoming a portable version for volumes of up to 10 liters and with an excellent performance, taking into account that, with the traditional method of the transducers being glued to the vats, the smaller they are, the more rigid they become, and therefore their yield decreases more.

A version of two electromechanical transducers at each end was tested and proved powers greater than 1 Kw were achieved.

What is claimed is:

1. Portable tubular ultrasound transducer, that generates cavitation in liquids, of the type that comprises at least one electromechanical transducer assembly, characterized in that said at least one electromechanical transducer assembly is embedded inside a metallic pipe, and comprises: one or more piezoelectric crystals which are fed from the exterior and are coupled to a first mass embedded at one end of said metallic pipe and to a second mass disposed in the interior of said metallic pipe and linked to said first mass; such portable tubular transducer being provided with a subjection medium.

2. Portable tubular transducer according to claim 1, characterized in that it comprises an electromechanical transducer assembly, connected by means of cables with an exterior power supply, being disposed at one end of said metallic pipe, and, because said subjection medium is disposed at the other end of the metallic pipe and arranged by a countermass embedded in said other end, and by a smaller diameter metallic pipe which is fixed to said countermass, and having a handle associated with said smaller diameter metallic pipe; displaying said countermass, said smaller diameter metallic pipe, and said handle, a passing drilled-hole as means of passageway to the feeding cables.

3. Portable tubular transducer, according to claim 1 or 2, characterized in that said second mass is linked to the first mass by the prestressed of a central rod.

4. Portable tubular transducer, according to claim 1, characterized in that it comprises an electromechanical transducer assembly, connected by cables to an exterior power supply, and that is located at one end of said metallic pipe, and because said subjection medium is located at the other end of the metallic pipe and arranged by a countermass embedded in said other end, and by a smaller diameter metallic pipe which is fixed to said countermass and being associated to said smaller diameter metallic pipe a hollow flexible pipe, displaying said countermass, such smaller diameter metallic pipe, and said hollow flexible pipe, a passing drilled-hole, as a means of passageway to the feeding cables.

5. Portable tubular transducer, according to claim 1, characterized in that it comprises two electromechanical transducer assemblies, the first masses of each one of them being embedded in one of the ends of the metallic pipe, and having a subjection medium in the central part of said metallic pipe.

6. Portable tubular transducer, according to claim 5, characterized in that said second masses are linked to said first masses by the prestress of an central rod.

7. Portable tubular transducer, according to claim 5, characterized in that said subjection medium consists of a pipe with smaller diameter said tube being fixed to said metallic pipe and provided with fixing means to the wall of a vat, and of a passing drilled-hole as means of passageway to the feeding cables.

* * * * *